(12) United States Patent
Nakamura et al.

(10) Patent No.: US 12,068,128 B2
(45) Date of Patent: Aug. 20, 2024

(54) CHARGED PARTICLE BEAM SYSTEM

(71) Applicant: Hitachi High-Tech Corporation, Tokyo (JP)

(72) Inventors: Yusuke Nakamura, Tokyo (JP); Yusuke Abe, Tokyo (JP); Kenji Tanimoto, Tokyo (JP); Takeyoshi Ohashi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 141 days.

(21) Appl. No.: 17/702,343

(22) Filed: Mar. 23, 2022

(65) Prior Publication Data
US 2022/0351938 A1 Nov. 3, 2022

(30) Foreign Application Priority Data
Apr. 28, 2021 (JP) ................. 2021-076608

(51) Int. Cl.
  *H01J 37/28* (2006.01)
  *H01J 37/244* (2006.01)
  *H01J 37/26* (2006.01)
(52) U.S. Cl.
  CPC ............ *H01J 37/28* (2013.01); *H01J 37/244* (2013.01); *H01J 37/265* (2013.01); *H01J 2237/24475* (2013.01); *H01J 2237/2448* (2013.01)
(58) Field of Classification Search
  CPC .. H01J 37/00; H01J 37/02; H01J 37/26; H01J 37/28; H01J 37/244; H01J 37/265; H01J 37/10; H01J 37/241; H01J 2237/24475; H01J 2237/2448; H01J 2237/004; H01J 2237/10; H01J 2237/21; H01J 2237/281

USPC .......................................... 250/306, 307, 311
See application file for complete search history.

(56) References Cited

U.S. PATENT DOCUMENTS

| | | | | |
|---|---|---|---|---|
| 5,486,769 | A * | 1/1996 | Chim | G01R 31/305 250/311 |
| 2002/0148960 | A1 | 10/2002 | Todokoro et al. | |
| 2017/0047192 | A1* | 2/2017 | Frosien | H01J 37/28 |
| 2019/0362929 | A1* | 11/2019 | Yamamoto | H01J 37/145 |
| 2021/0043420 | A1* | 2/2021 | Ohashi | H01J 37/28 |
| 2021/0272770 | A1 | 9/2021 | Sohda et al. | |

FOREIGN PATENT DOCUMENTS

| | | |
|---|---|---|
| JP | 2000-133194 A | 5/2000 |
| JP | 2013-33739 A | 2/2013 |
| JP | 2017-37843 A | 2/2017 |
| WO | WO 2020/008492 A1 | 1/2020 |

* cited by examiner

*Primary Examiner* — Jason L McCormack
(74) *Attorney, Agent, or Firm* — Crowell & Moring LLP

(57) ABSTRACT

An object of the invention is to acquire a high-quality image while maintaining an improvement in throughput of image acquisition (measurement (length measurement)). The present disclosure provides a charged particle beam system including a charged particle beam device and a computer system configured to control the charged particle beam device. The charged particle beam device includes an objective lens, a sample stage, and a backscattered electron detector that is disposed between the objective lens and the sample stage and that adjusts a focus of a charged particle beam with which a sample is irradiated. The computer system adjusts a value of an electric field on the sample in accordance with a change in a voltage applied to the backscattered electron detector.

16 Claims, 12 Drawing Sheets

[FIG. 1]
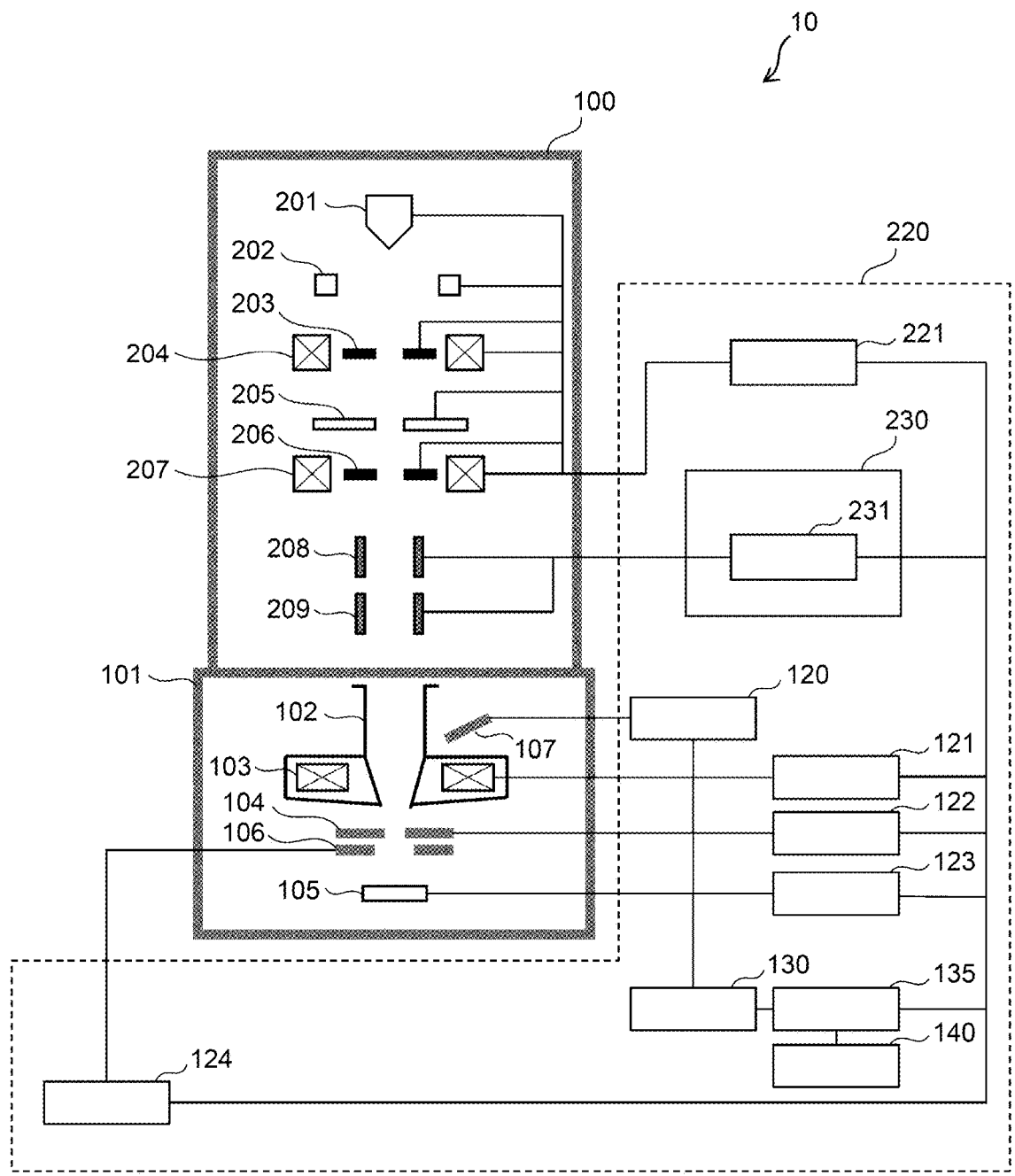

[FIG. 2]
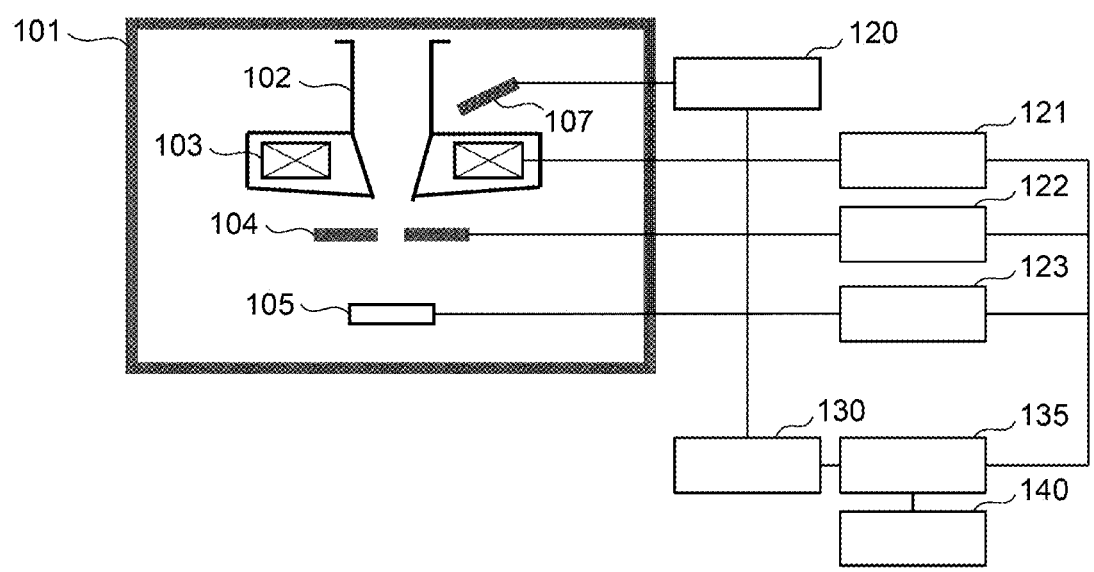

[FIG. 3]
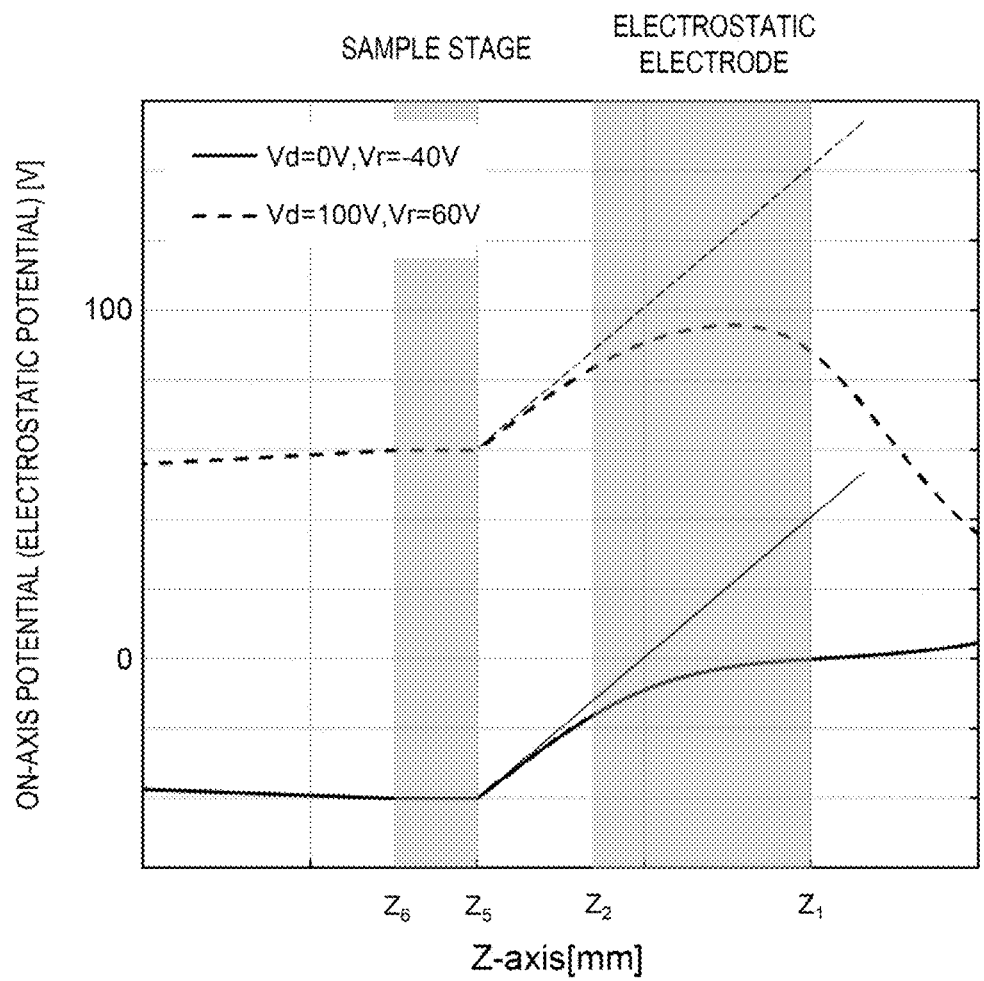

[FIG. 4]
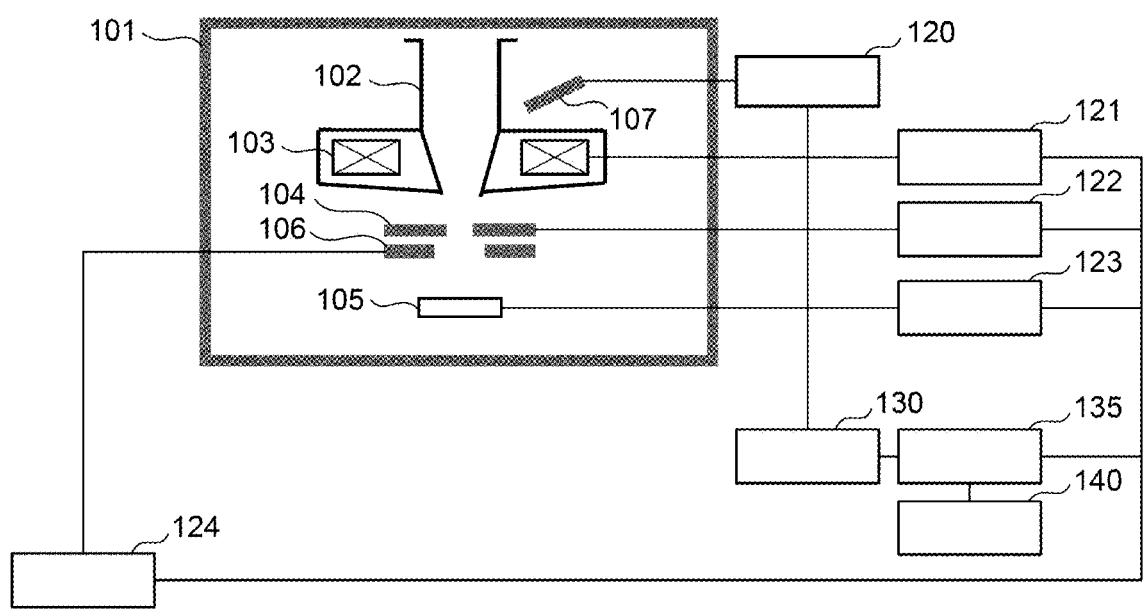

[FIG. 5]
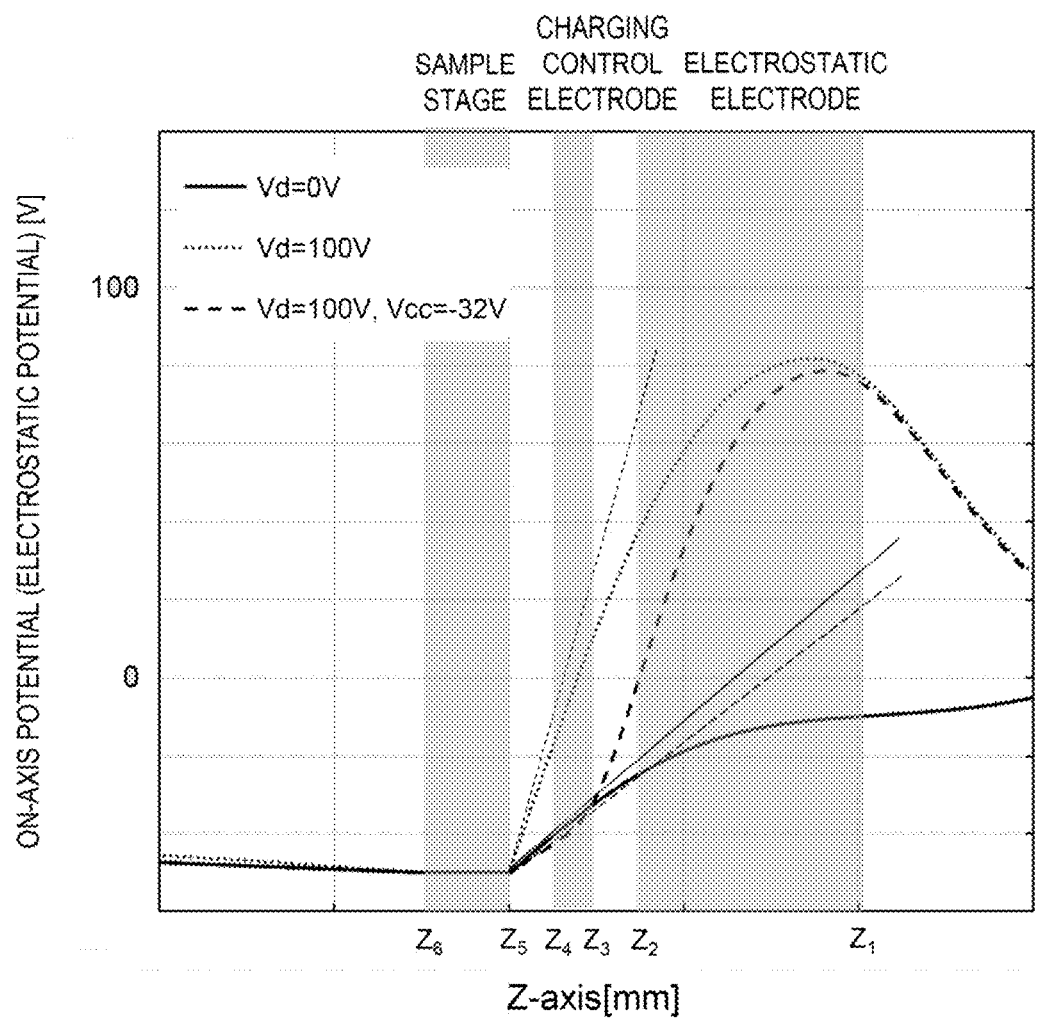

[FIG. 6]
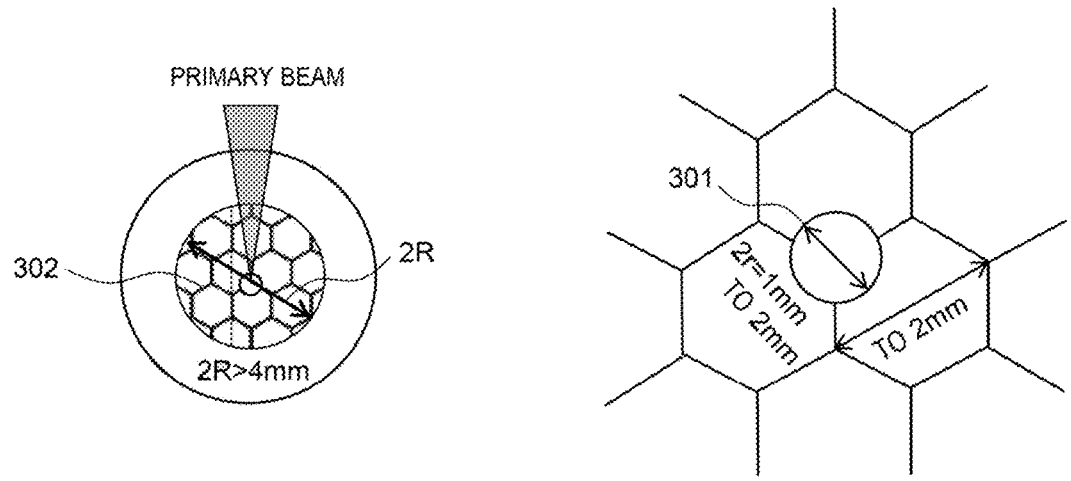

[FIG. 7]
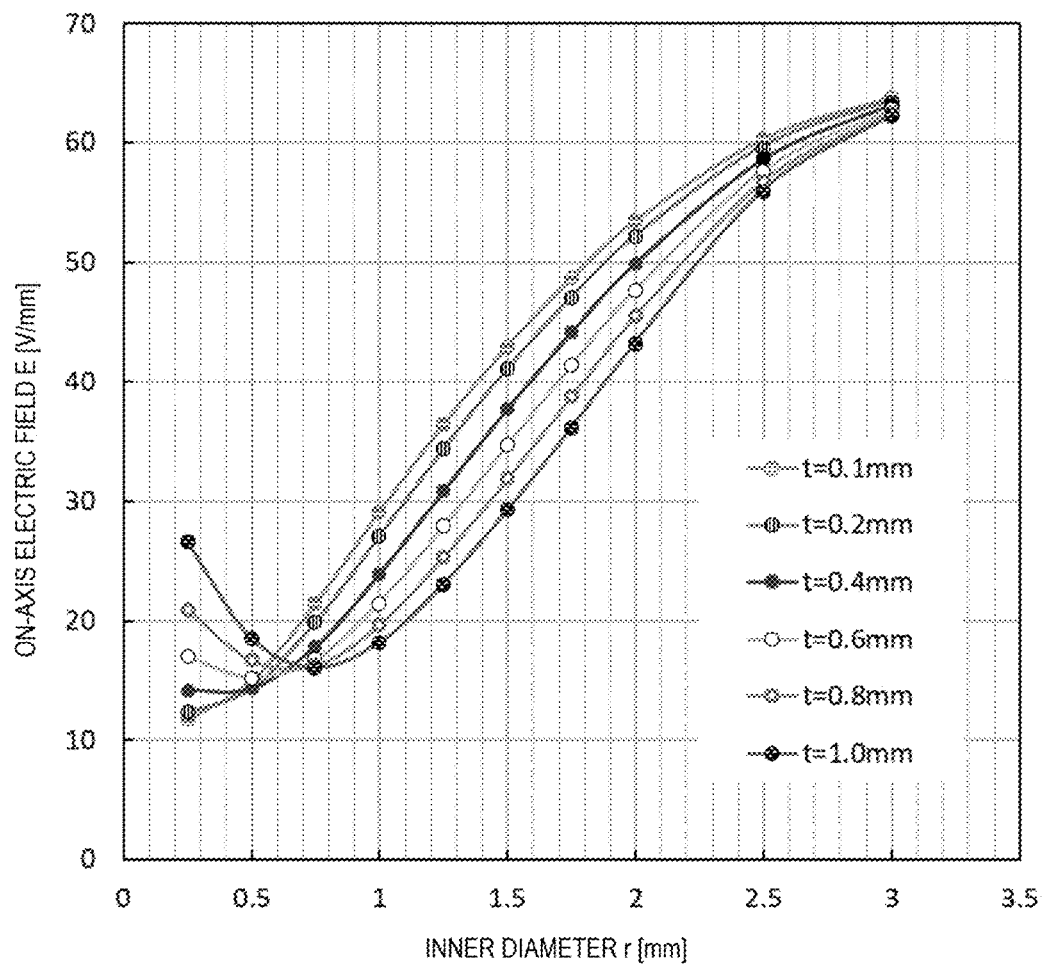

[FIG. 8]
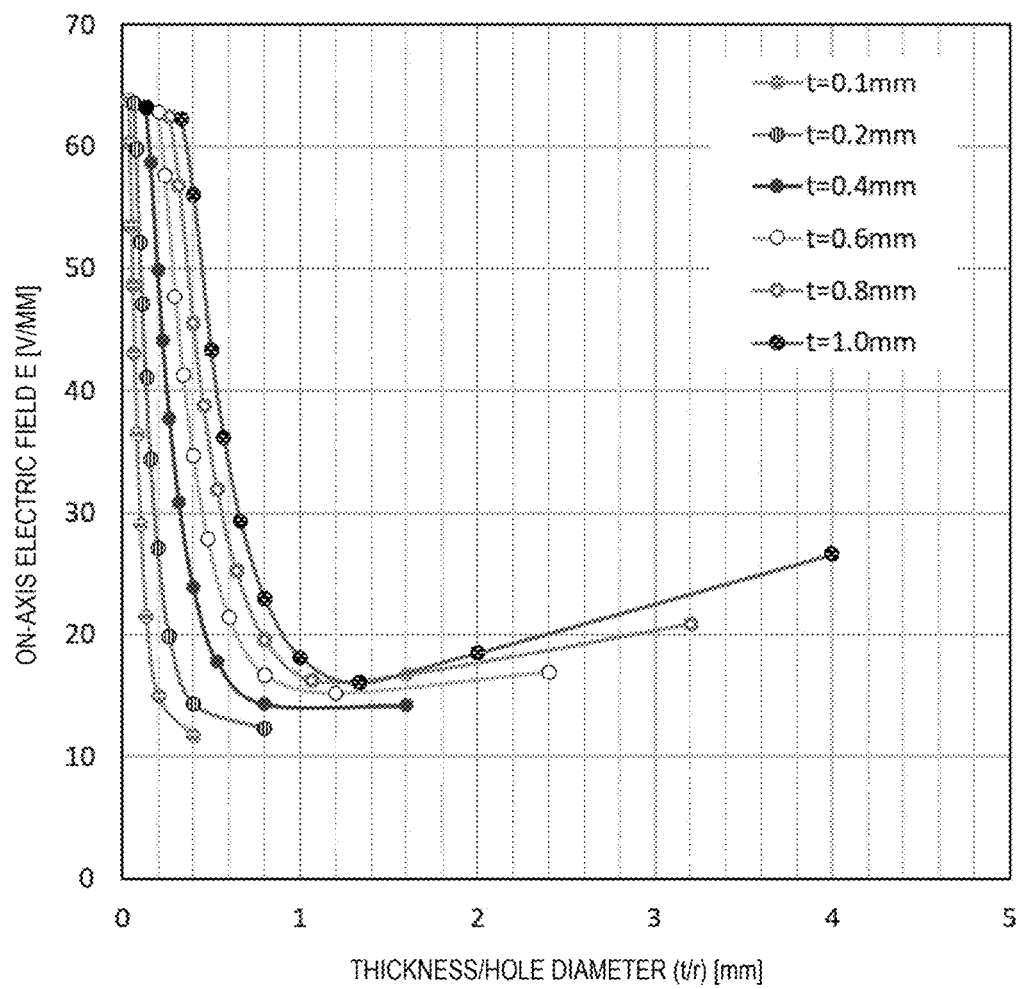

[FIG. 9]
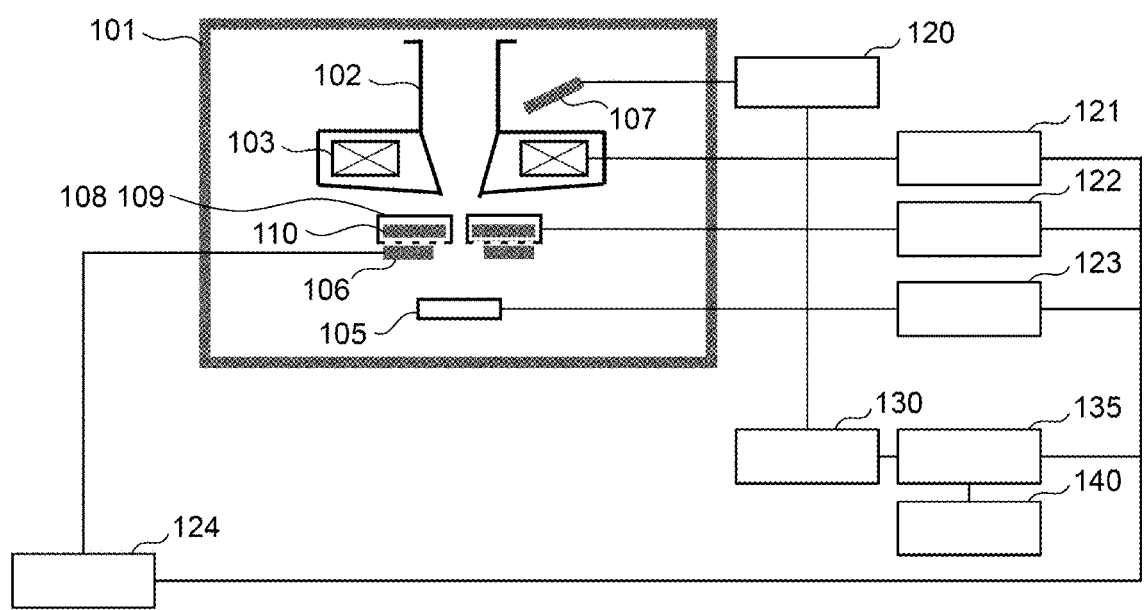

[FIG. 10]
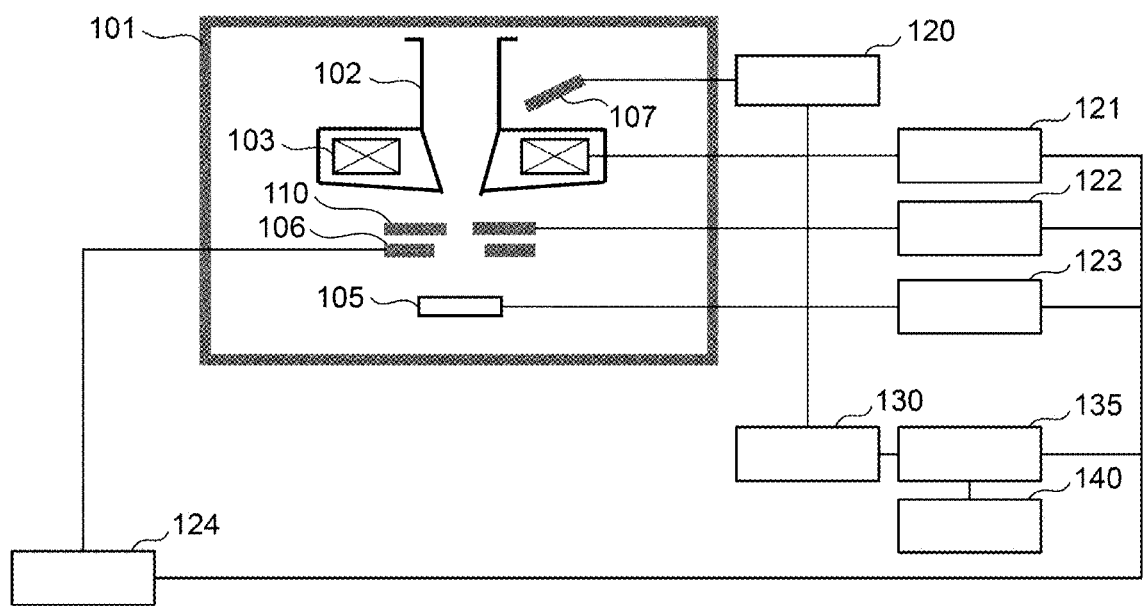

[FIG. 11]
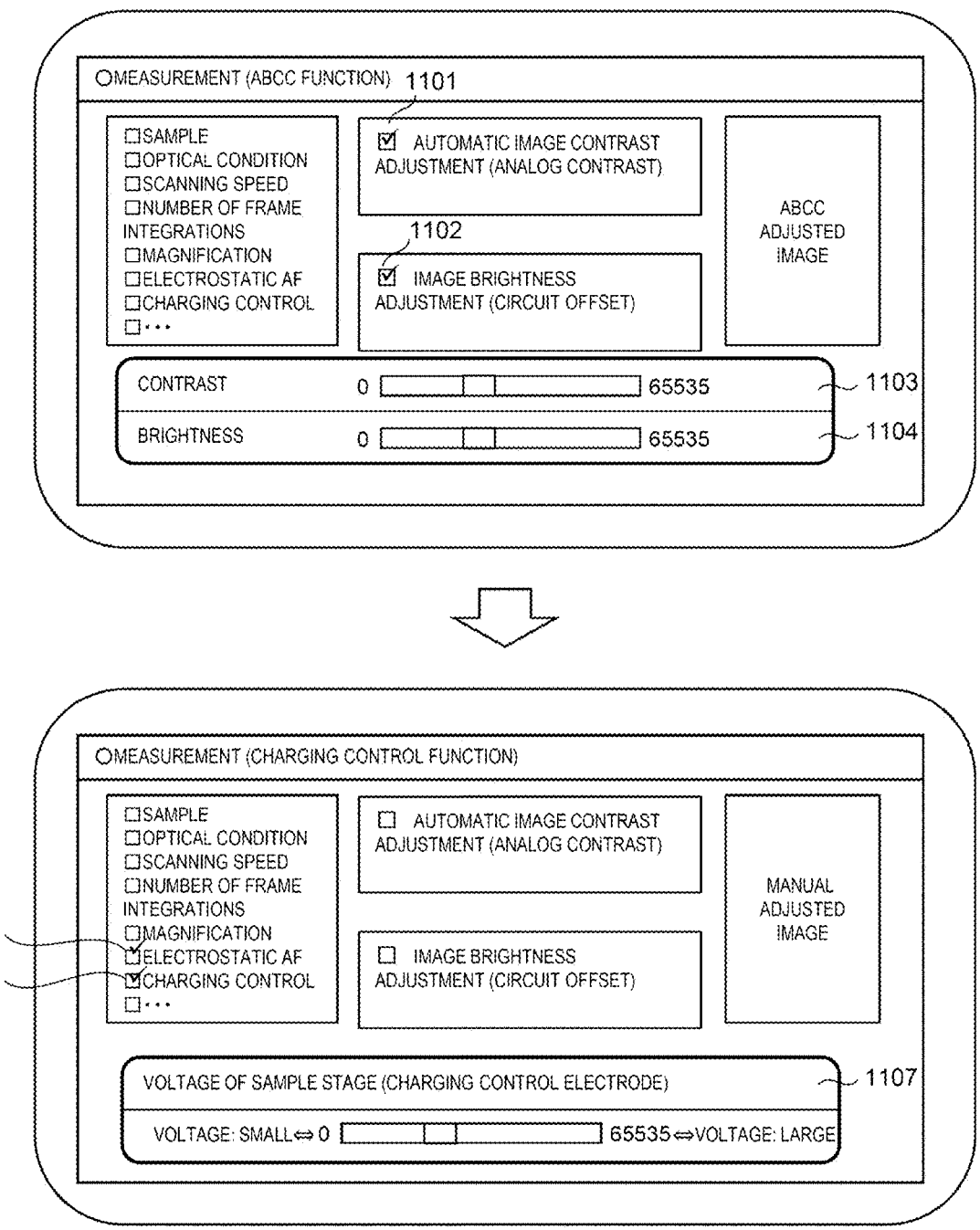

[FIG. 12]
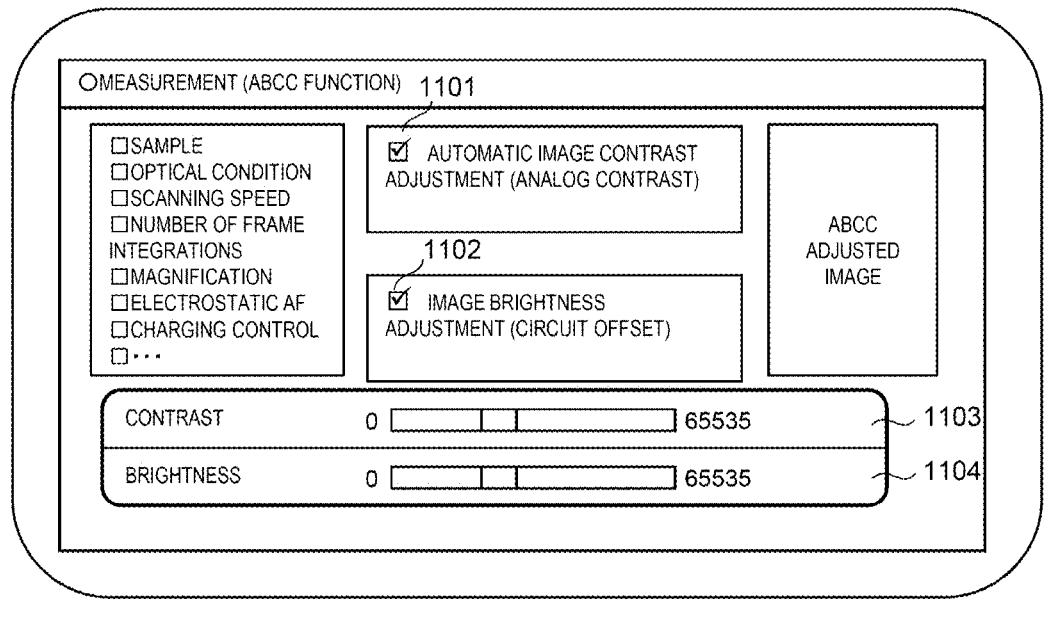
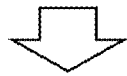
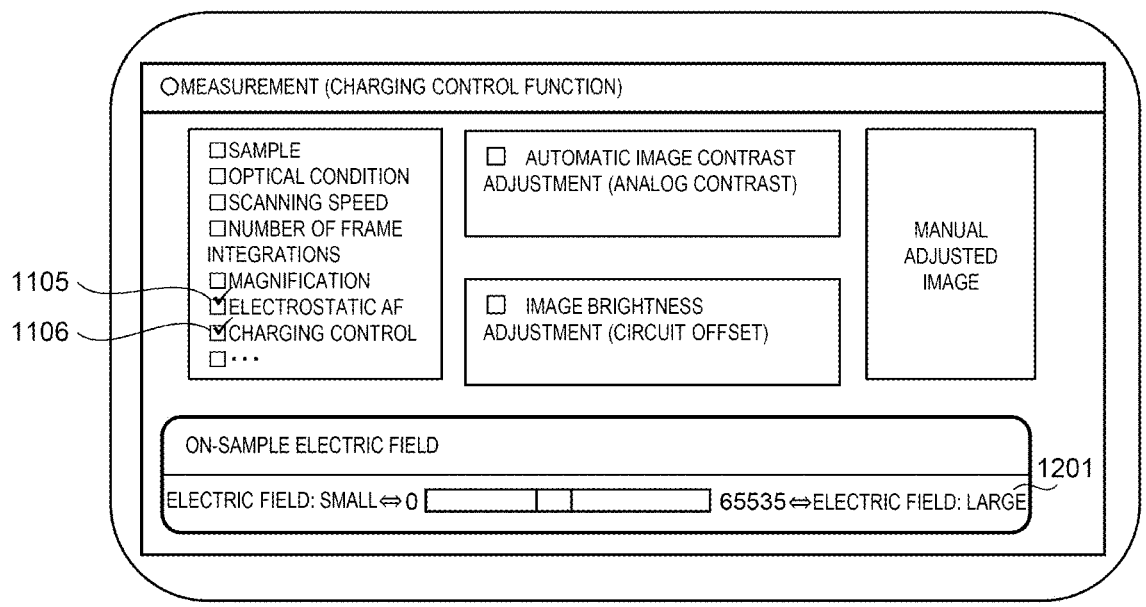

CHARGED PARTICLE BEAM SYSTEM

TECHNICAL FIELD

The present disclosure relates to a charged particle beam system.

BACKGROUND ART

In a charged particle beam device, a high voltage is applied to a special metal to generate charged particles (electrons and ions). When the metal is a chip or an emitter and the charged particles are electrons, this generating device is referred to as an electron gun. A deflector and an optical system such as a condenser lens are disposed in order to deflect the generated charged particles or change a beam diameter or a focus. By irradiating a charged particle beam to a sample while performing scanning with the charged particle beam, charged particles are generated from the sample. In the case of an electron beam, the charged particles generated from the sample consist of secondary electrons and backscattered electrons (BSE). The electrons with which the sample is irradiated are referred to as primary electrons. The secondary electrons and the backscattered electrons (BSE) are detected by a radiation detector such as an ET detector. After a detection signal is amplified by a signal processing device, the signal is converted into a digital signal using an analog-to-digital converter (ADC), and is output as an image.

A backscattered electron image is suitable for obtaining composition and unevenness information of a sample. In recent years, in the field of semiconductors, in addition to miniaturization, an aspect ratio has been increased. For example, there is an increasing need for measuring a deep hole structure or a deep groove structure of a 3D NAND device. It is known that such a high aspect structure can be measured with a backscattered electron image of a high acceleration SEM. In order to effectively detect the backscattered electrons, it is necessary to take in high energy elastically scattered electrons that are scattered on a surface of the sample and that are emitted at a high angle and relatively low energy inelastically scattered electrons that are generated in a deep portion of the sample and that are emitted at a low angle. Therefore, it is desirable that a backscattered electron detector be disposed directly above the sample. In general, the backscattered electron detector has an opening (hole) through which primary electrons and secondary electrons pass, and often has an annular shape. In order to detect the backscattered electrons generated from the sample without almost losing energy of those emitted at an extremely high angle, the backscattered electron detector may be disposed above an objective lens in a column.

Since a secondary electron image is an image generated based on electrons generated on the surface of the sample, the secondary electron image is sensitive to a state of a portion near the surface of the sample. Therefore, when the sample is a sample having no conductivity such as an insulator, the secondary electron image is likely to be influenced by charging (charge-up). It is known that there are roughly two types of influences when charging occurs. One is a notable to an extent that a primary electron beam is deflected by the charging, and is observed when a relatively high acceleration voltage is used. The other occurs when an insulator is observed at a low acceleration, and is a case where an abnormal contrast occurs. When the sample is charged, a negative charge is accumulated near the surface, and thus the image becomes partially bright or dark. Becoming dark is due to an influence of secondary electrons repulsed and accelerated by the negative charge, and becoming dark is due to generation of secondary electrons that do not enter the detector since trajectories thereof are bent by the negative charge.

Depending on the sample, there is a case where it is desired to keep the charge in a substantially zero state and there is a case where the sample is intentionally charged to have a negative potential or a positive potential. In either case, although an occurrence of unintended charging itself is a problem, the biggest problem is that a charging state cannot be controlled.

As described in PTL 1, there is a method of controlling a charging state by adjusting an electric field on a sample to change trajectories, energy, yield (electric charge flowing out) of secondary electrons and an amount of secondary electrons returning to the sample (electric charge flowing in). In PTL 1, "a charging control electrode is provided at a side of a sample to be inspected", and "a constant voltage is applied to the charging control electrode according to a charging state of the sample, thereby preventing a change in the charging state of the surface of the sample formed before the inspection".

PTL 2 discloses a configuration in which "a control electrode is added" between an objective lens and a sample and a voltage is applied thereto by a "control voltage power supply" to "freely control an electric field on a surface of the sample".

PTL 3 discloses a device that includes a "proxy electrode" disposed between a "magnetic-electrostatic objective lens" and a "sample stage", and that is "used as a deceleration electric field type device or a part of a deceleration electric field type lens to decelerate a primary beam" or "controls an intensity of an extraction field for secondary particles".

As described regarding a principle of charging control in PTL 2, when the control electrode is disposed between an electrostatic electrode and the sample, if the control electrode and a sample stage have the same potential, the electric field on the sample becomes zero, and if the control electrode and the electrostatic electrode have the same potential, the electric field on the sample is almost the same as that in the case where the control electrode is not disposed. Therefore, by setting a potential of the control electrode to an intermediate value, it is possible to generate any electric field on the sample between the electrostatic electrode and the sample.

On the other hand, in order to clearly observe a structure and material of the sample at a high magnification, it is necessary to appropriately adjust a focus of primary electrons. In general, an objective lens, which is a magnetic field lens, is used for adjusting a focus of a primary electron beam. Examples of types of the objective lens include an out-lens type, an in-lens type, and a semi-in-lens (snorkel lens) type. It is also possible to adjust the focus of the primary electrons by using an electrostatic lens. In a low-acceleration SEM, a positive voltage is applied to a booster in a column or a negative voltage is applied to the sample stage (retarding) to form a deceleration optical system, thereby obtaining an effect of the electrostatic lens. Although the electrostatic lens is inferior to the objective lens in an adjustable range, the electrostatic lens can respond at a high speed. In a current semiconductor measurement apparatus or semiconductor inspection apparatus, an index called throughput, which is the number of measurements and inspections per unit time, is regarded important, and the throughput can be improved by using both the objective lens and the electrostatic lens.

In this regard, according to PTL 4, in a case where an objective lens is a semi-in-lens type, a focus correction sensitivity of an electrostatic electrode is improved when an electrostatic potential and a magnetic flux density distribution overlap each other. Since a peak (maximum point) of the magnetic flux density is located at a position several millimeters away from a tip of the objective lens, it is necessary to place the electrostatic electrode immediately below the objective lens. That is, it is necessary to dispose the electrostatic electrode in a space of about 5 mm at most between the objective lens and a sample. However, here, a backscattered electron detector having a thickness of at least 2 mm is disposed, and there is no spatial margin. For this reason, a voltage is applied to the backscattered electron detector so that the backscattered electron detector functions as the electrostatic electrode, thereby contributing to improving a throughput.

CITATION LIST

Patent Literature

PTL 1: JP-A-2013-33739
PTL 2: JP-A-2000-133194
PTL 3: JP-A-2017-37843
PTL 4: WO2020/008492A1

SUMMARY OF INVENTION

Technical Problem

In PTL 4, a voltage of about 0 V to +1000 V is generally applied to the electrostatic electrode (backscattered electron detector 104) disposed at a position of the principal surface of the objective lens, and a voltage of about −100 V to 0 V is applied to a sample stage. In this case, since the electrostatic electrode and the sample are present at a very short distance from each other, fluctuation of an electric field on the sample becomes severe (disturbance occurs in the electric field on the sample). For this reason, in such a system, a charging state of the sample may greatly change. When an image contrast is sensitive to charging (for example, a secondary electron image or the like), there is a possibility that length measurement performance and length measurement reproducibility are adversely influenced. Therefore, it is necessary to correct the fluctuation (disturbance) of the electric field on the sample. When the electrostatic electrode (booster) is disposed above or inside the objective lens, the fluctuation of the electric field on the sample is small. Therefore, this problem is a problem specific to a case where an electrostatic focus correction is performed with the semi-in-lens type.

In view of such circumstances, the present disclosure proposes a technique of acquiring a high-quality image while maintaining an improvement in throughput of image acquisition (measurement (length measurement)).

Solution to Problem

In order to solve the above problem, an embodiment of the present disclosure provides a charged particle beam system that includes a charged particle beam device and a computer system configured to control the charged particle beam device. The charged particle beam device includes an objective lens, a sample stage, and a backscattered electron detector that is disposed between the objective lens and the sample stage and that adjusts a focus of a charged particle beam with which a sample is irradiated. The computer system adjusts a value of an electric field on the sample in accordance with a change in a voltage applied to the backscattered electron detector.

More features relevant to the present disclosure will be apparent from a description of the specification and the accompanying drawings. Aspects of the present disclosure may be achieved and implemented by means of the elements and combinations of various elements and the following detailed description and the accompanying claims.

Descriptions in this specification are merely exemplary, and are not intended to limit the scope of the claims or application of the present disclosure in any aspect.

BRIEF DESCRIPTION OF DRAWINGS

FIG. 1 shows an overall schematic configuration example of a semiconductor measurement system (also referred to as a charged particle beam system) 10 according to the present disclosure.

FIG. 2 shows a configuration example for implementing detection of secondary electrons and backscattered electrons according to a first embodiment.

FIG. 3 shows electrostatic potentials (on-axis potentials) of the system that correspond to respective positions of an electrostatic electrode (backscattered electron detector 104) and a sample stage 105.

FIG. 4 shows a configuration example for implementing detection of secondary electrons and backscattered electrons according to a second embodiment.

FIG. 5 shows electrostatic potentials (on-axis potentials) of the system that corresponding to respective positions of the electrostatic electrode (backscattered electron detector 104), a charging control electrode 106, and the sample stage 105.

FIG. 6 shows a configuration example of the charging control electrode 106.

FIG. 7 shows a relation between an inner diameter r and an on-axis electric field E with respect to various thicknesses t of charging control electrodes 106.

FIG. 8 shows a relation between the ratio of the thickness t of the charging control electrode 106 to the inner diameter r of the charging control electrode 106 and the on-axis electric field E.

FIG. 9 shows a configuration example in which a semiconductor detector 110 is disposed between an objective lens 103 and the sample stage 105.

FIG. 10 shows a configuration example in which a reverse bias voltage is applied to the semiconductor detector 110 serving as the backscattered electron detector 104.

FIG. 11 shows a configuration example of a voltage value setting GUI applicable to the first and second embodiments.

FIG. 12 shows a configuration example of an on-sample electric field value setting GUI applicable to the first and second embodiments.

DESCRIPTION OF EMBODIMENTS

The present embodiment relates to a charged particle beam system that includes an objective lens and an electrode for adjusting a focus of a charged particle beam and that outputs a luminance image based on a detection signal. The present embodiment proposes a technique of acquiring a high-quality image while maintaining an improvement in throughput of image acquisition (measurement (length measurement)) by correcting fluctuation of an electric field on a sample caused by the focus adjustment.

(A) First Embodiment

The first embodiment proposes a technique of correcting (removing) disturbance of an electric field on a sample without providing a charging control electrode.

Configuration Example of Semiconductor Measurement System

FIG. 1 shows an overall schematic configuration example of a semiconductor measurement system (also referred to as a charged particle beam system) 10 according to the present disclosure. The semiconductor measurement system 10 includes a charged particle beam device 100 and a control system (also referred to as a computer system) 220.

The charged particle beam device 100 includes an electron gun 201, aligners 202 and 206, condenser lenses 204 and 207, scanning deflectors 208 and 209, an objective lens 103, a backscattered electron detector 104, and a sample stage 105. In a second embodiment described later, the charged particle beam device 100 further includes a charging control electrode 106.

The control system (computer system) 220 includes a detector control unit 120, an objective lens control unit 121, an electrostatic electrode voltage control unit 122, a sample stage voltage control unit 123, an electron optical control unit 221, a scanning control unit 230 including a deflection control unit 231, an image processing unit 130, a control unit 135, and a graphical user interface (GUI) 140.

In the charged particle beam device 100, the electron gun 201 emits a primary electron beam. The emitted primary electron beam passes through the aligners 202 and 206, the condenser lenses 204 and 207, the scanning deflectors 208 and 209, the objective lens 103, and the backscattered electron detector 104, is converged and used for scanning, and is irradiated to a sample such as a semiconductor wafer. Here, the objective lens 103 is an electromagnetic lens.

The aligners 202 and 206, the condenser lenses 204 and 207, the scanning deflectors 208 and 209, the objective lens 103, and the backscattered electron detector 104 are controlled by the electron optical control unit 221, the deflection control unit 231 of the scanning control unit 230, the objective lens control unit 121, and the electrostatic electrode voltage control unit 122, respectively. Signal electrons caused due to the irradiation of the primary electron beam and emitted from the sample are detected by a secondary electron detector 107 and are processed by the detector control unit 120. The primary electron beam is deflected by the scanning deflectors 208 and 209 to scan a surface of the sample. The image processing unit 130 can generate an image by synchronizing an output signal of the detector control unit 120 with a control signal of the deflection control unit 231 that is applied to the scanning deflectors 208 and 209, output an SEM image to the GUI 140, and store the image as image data in the image processing unit 130.

The sample is held on the sample stage 105. The stage (not shown) can be moved by a stage control unit (not shown). Accordingly, the SEM image can be acquired by moving a field of view of the sample and irradiating a desired portion on the surface thereof with the primary electron beam. Movement of a field of view of the primary electron beam can be implemented not only by the stage but also by deflecting the primary electron beam using a deflector (not shown) for moving the field of view.

The control system 220 can be implemented by a general computer (including a processor, a storage device such as a memory, an input device such as a mouse or a keyboard, an output device such as a display, a communication device, and the like). The processor of the control system 220 reads various programs corresponding to the respective processing units (the detector control unit 120, the objective lens control unit 121, the electrostatic electrode voltage control unit 122, the sample stage voltage control unit 123, the electron optical control unit 221, the scanning control unit 230 including the deflection control unit 231, the image processing unit 130, and the control unit 135) that are stored in the memory from the memory, and loads the programs to an internal memory of the processor to implement the respective processing units. In FIG. 1, although only configurations of the processing units implemented by the processor of the control system 220 are shown, the control system 220 also includes other configurations (the storage device, the input device, the output device, the communication device, and the like).

Configuration for Detecting Secondary Electrons and Backscattered Electrons

FIG. 2 shows a configuration example for implementing detection of secondary electrons and backscattered electrons according to the first embodiment.

The objective lens control unit 121 changes a current of a coil of the objective lens 103 to adjust a position in a height direction (hereinafter, referred to as a focus position or a focus height), at which the primary electron beam converges, to a desired focus state. Alternatively, the electrostatic electrode voltage control unit 122 changes a voltage of an electrostatic electrode (backscattered electron detector 104) to adjust the focus position (focus height) of the primary electron beam to a desired focus state. The desired focus state referred to here is usually a state in which the focus position and a height of a surface of the sample coincide with each other, and may be a state in which resolution is minimized, or may be a state that is freely set by a user.

Electrostatic Potential Corresponding to Positions of Electrostatic Electrode and Sample Stage FIG. 3 shows electrostatic potentials (on-axis potentials) of the system that correspond to respective positions of the electrostatic electrode (backscattered electron detector 104) and the sample stage 105. Here, a height of an upper end of the electrostatic electrode (backscattered electron detector 104) is $z_1$, a height of a lower end thereof is $z_2$, a height of an upper end of the sample stage 105 is $z_5$, and a height of a lower end thereof is $z_6$. A potential $V_d$ of the electrostatic electrode (backscattered electron detector 104) is set such that a focus of the primary electron beam is in the desired focus state, and at the same time, a potential $V_r$ of the sample stage 105 is set such that an electric field $E_s$ on the sample is at a value set in advance, thereby enabling charging control. In the first embodiment, since the electric field $E_s$ on the sample is an overlay of an electric field generated by the potential $V_d$ of the electrostatic electrode (backscattered electron detector 104) and an electric field generated by the potential $V_r$ of the sample stage 105, the electric field $E_s$ is uniquely determined as a function of the potentials $V_d$ and $V_r$.

In FIG. 3, a solid line represents a state in which no voltage is applied to the electrostatic electrode (backscattered electron detector 104). A solid straight line represents an inclination of the potential on the surface of the sample, that is, the electric field $E_s$ on the sample (an electric field value of the surface $z_s$ of the sample). In FIG. 3, a dashed line represents a state in which a voltage is applied to the electrostatic electrode (backscattered electron detector 104), the focus of the primary electron beam is adjusted, a voltage is applied to the sample stage 105, and charging is controlled. A dashed straight line represents an inclination of the potential on the surface of the sample after the focus adjustment and the charging control, that is, the electric field $E_s$ on the sample after the focus adjustment and the charging control.

In order to adjust the focus of the primary electron beam, it is assumed that the voltage $V_d$ applied to the electrostatic electrode is increased only by $\Delta V$. At this time, in order that the electric field $E_s$ on the sample is the same as that before the focus adjustment, it is necessary to increase the voltage $V_r$ of the sample stage 105 by $\alpha \Delta V$. For example, when a voltage of 100 V is applied to the electrostatic electrode, an applied voltage to the sample stage 105 is also changed in accordance with 100 V. That is, when a voltage of −40 V is applied to the sample stage 105, the applied voltage is changed to +60 V. In this way, the voltage of the sample stage is set such that the electric field on the sample is the same before and after the voltage $V_d$ of the electrostatic electrode is changed. The above $\alpha$ is a proportionality coefficient taken in consideration of a case where there is another disturbance, and takes a value in a range of 0 to 1. Normally, $\alpha$ to 1 is the optimum value. When there is a disturbance, in order to eliminate an influence of the disturbance, an amount of change in the applied voltage of the sample stage 105 may be determined using a least-squares method or the like such that the inclination (electric field $E_s$ on the sample) of the electrostatic potential (on-axis potential) at the position $z_s$ is constant before and after change of the applied voltage of the electrostatic electrode.

(B) Second Embodiment

A second embodiment proposes a configuration in which a charging control electrode is provided in order to control the disturbance of an electric field on a sample.

Configuration for Detecting Secondary Electrons and Backscattered Electrons

FIG. 4 shows a configuration example for implementing detection of secondary electrons and backscattered electrons according to the second embodiment.

When the potential $V_r$ of the sample stage 105 is limited by another factor (deceleration electric field (retarding) or the like), the method described in the first embodiment cannot be used. This is because, when the sample is observed by a retarding method, a constant voltage (fixed value) is applied to the sample stage 105, and thus a voltage value applied to the sample stage 105 cannot be changed. Therefore, in such a case, as shown in FIG. 4, the charging control electrode 106 is disposed between the electrostatic electrode (backscattered electron detector 104) and the sample stage 105, and a potential of the charging control electrode 106 is set according to a potential of the electrostatic electrode such that the electric field $E_s$ on the sample is constant. Accordingly, the charging state of the sample can be kept constant. Here, a voltage of the electrostatic electrode (backscattered electron detector 104) is set as $V_d$, a voltage of the charging control electrode 106 is set as $V_{cc}$, and the voltage of the sample stage 105 is set as $V_r$. In the second embodiment, since the electric field $E_s$ on the sample is an overlay of electric fields generated by the potential $V_d$ of the electrostatic electrode (backscattered electron detector 104), the potential $V_{cc}$ of the charging control electrode 106, and the potential $V_r$ of the sample stage 105, the electric field $E_s$ is uniquely determined as a function of the potentials $V_d$, $V_{cc}$, and $V_r$.

FIG. 5 shows electrostatic potentials (on-axis potentials) of the system that correspond to respective positions of the electrostatic electrode (backscattered electron detector 104), the charging control electrode 106, and the sample stage 105. In FIG. 5, a solid line ($V_d$=0 V) represents a state in which no voltage is applied to the electrostatic electrode (backscattered electron detector 104). A solid straight line represents an inclination of a potential on a surface of the sample, that is, the electric field $E_s$ on the sample. In FIG. 5, a dotted line ($V_d$=100 V) represents a state in which a voltage is applied to the electrostatic electrode (backscattered electron detector 104) and a focus of a primary electron beam is adjusted. A dotted straight line represents an inclination of the potential on the surface of the sample after the focus adjustment, that is, the electric field $E_s$ on the sample after the focus adjustment. In FIG. 5, a dashed line ($V_d$=100 V, $V_{cc}$=−32 V) represents a state in which a voltage is applied to the electrostatic electrode (backscattered electron detector 104), the focus of the primary electron beam is adjusted (for example, the focus adjustment is performed along with movement of a field of view), a voltage is applied to the charging control electrode 106, and charging on the surface of the sample is controlled. A dashed straight line represents an inclination of the potential on the surface of the sample after the focus adjustment and the charging control, that is, the electric field $E_s$ on the sample after the focus adjustment and the charging control. It can be seen from the dotted line that the electric field on the sample stage 105 is larger than that in a case where no voltage is applied to the electrostatic electrode (solid line). In order to correct this matter, the voltage $V_{cc}$ is applied to the charging control electrode 106. A graph at this time is represented by a dashed line, and it can be seen that an inclination of the dashed line after correction is substantially the same as the inclination of the solid line before the movement of the field of view.

The voltage $V_{cc}$ to be applied to the charging control electrode 106 is determined as follows. That is, a height of an upper end of the electrostatic electrode is set as $z_1$, a height of a lower end thereof is set as $z_2$, a height of an upper end of the charging control electrode 106 is set as $z_3$, a height of a lower end thereof is set as $z_4$, a height of an upper end of the sample stage 105 is set as $z_5$, and a height of a lower end thereof is set as $z_6$. At this time, when the electrostatic potential is set as $V(z)$, $V_d=V(z_1)=V(z_2)$, $V_{cc}=V(z_3)=V(z_4)$, and $V_r=V(z_5)=V(z_6)$ are established. These are fitted into a cubic function ($A_1x^3+B_1x^2+C_1x+D_1$). Since the electric field is given by differentiation of the electrostatic potential, the electric field can be expressed as in Equation (1).

[Equation 1]

$$E(z) = -\frac{dV(z)}{dz} = -3A_1z^2 - 2B_1z - C_1 \qquad (1)$$

Therefore, the electric field $E_s$ on the sample=$E(z_5)$ is given by Equation (2).

[Equation 2]

$$E(z_5)=-3A_1z_5^2-2B_1z_5-C_1 \qquad (2)$$

When the potential $V_d$ of the electrostatic electrode is changed by $\Delta V_d$, since the electric field $E_s$ on the sample is the same as that before the focus adjustment, it is assumed that the potential $V_{cc}$ of the charging control electrode 106 is changed by $\Delta V_{cc}$. At this time, $V_d+\Delta V_d=V(z_1)$, $V_d+\Delta V_d=V(z_2)$, $V_{cc}+\Delta V_{cc}=V(z_3)$, $V_{cc}+\Delta V_{cc}=V(z_4)$, $V_r=V(z_5)$, and $V_r=V(z_6)$ are established. Similarly, when these are fitted into a cubic function $(A_2x^3+B_2x^2+C_2x+D_2)$, the electric field $E_s$ on the sample=$E(z_5)$ is given by Equation (3).

[Equation 3]

$$E(z_5)=-3A_2z_5^2-2B_2z_5-C_2 \qquad (3)$$

Then, on an assumption that the electric field $E_s$ on the sample is the same before and after the focus adjustment, Equation (4) is established.

[Equation 4]

$$-3A_1z_5^2-2B_1z_5-C_1=-3A_2z_5^2-2B_2z_5-C_2 \qquad (4)$$

In actual algorithm, this calculation process is repeated a plurality of times while changing $\Delta V_{cc}$ in a fine step, and $\Delta V_{cc}$ at which a difference of $-3A_1z_5^2-2B_1z_5-C_1$ and $-3A_2z_5^2-2B_2z_5-C_2$ is minimized is searched. In the present embodiment, a solution search method is a least-squares method, and another calculation method can also be used. Although the case in which the cubic function is used has been described, the cubic function may be a higher order polynomial function.

Configuration Example of Charging Control Electrode 106

FIG. 6 shows a configuration example of the charging control electrode 106. As described above, the charging control electrode 106 is disposed directly above the sample and directly below the electrostatic electrode. As shown in FIG. 6, the charging control electrode 106 includes a first opening 301 that is sufficiently large to allow primary electrons and secondary electrons to pass therethrough. In the present embodiment, in order to allow use of an annular type detector, the opening is circular, and the same effect can be obtained even when the opening is square.

An inner diameter r of the first opening 301 needs to be sufficiently small such that the electrostatic potential leaks onto an optic axis. Otherwise, there is no effect of charging control. On the other hand, the inner diameter r of the first opening 301 needs to be sufficiently large such that an aberration of the primary electron beam is not influenced and such that detection efficiency of the secondary electrons is not influenced. It is desirable that the charging control electrode 106 has a thickness t of 0.1 mm or more in terms of processing. Since the thickness of the charging control electrode 106 needs to be smaller than a distance between the backscattered electron detector 104 and the sample stage 105, the thickness t needs to be 2 mm to 3 mm or less.

From a simulation, there is an optimum relation between the thickness t and the inner diameter r of the charging control electrode 106, and it is necessary that $0.01 \leq t/r \leq 1$. FIG. 7 shows a relation between the inner diameter r and an on-axis electric field E with respect to the various thicknesses t of charging control electrodes 106. It can be seen that when the inner diameter r is increased, the on-axis electric field E is saturated (see a case of the inner diameter r=3 mm). This fact shows that, since the secondary electrons pass through a center of the opening, there is no effect of charging control when a distance between the charging control electrode 106 and the optic axis increases.

FIG. 8 shows a relation between the ratio of thickness t of the charging control electrode 106 to the inner diameter r of the charging control electrode 106 and the on-axis electric field E. As can be seen from FIG. 8, if the charging control electrode 106 is too close to the sample, the effect of charging control cannot be attained conversely. Ideally, the best effect is obtained at a minimum point (near t/r to 1) of a curve. From this fact, $t/r \leq 1$ is derived. However, in a case where the thickness is very small (t<0.1), there is a problem when t~r<0.1. This is because, if r>0.5 is not satisfied, interference with the primary electron beam is caused. Therefore, although the maximum effect cannot be obtained, if a case where about 30% or more of the maximum effect is obtained is acceptable, $0.01 \leq t/r$ is derived.

The charging control electrode 106 is disposed directly below the backscattered electron detector 104, and as shown in FIG. 6, the charging control electrode 106 includes a second opening 302 for allowing backscattered electrons to pass therethrough. The second opening 302 needs to be large enough so as not to influence detection efficiency of the backscattered electrons. This is because, since a positive (negative) voltage is applied to the charging control electrode 106, if the backscattered electrons are accelerated (decelerated), brightness is evaluated excessively or insufficiently. This is understood by considering light emission characteristics of a scintillator (when the scintillator is a single crystal, an amount of light is proportional to an acceleration voltage of incident electrons). The second opening 302 has a mesh shape, and may have a lattice shape or a honeycomb shape, but is not limited thereto. From the simulation, in order not to influence the detection efficiency of the backscattered electrons, a diameter of the mesh needs to be 2 mm or more. When the second opening 302 has a lattice shape or a honeycomb shape, a major axis of the opening, that is, a distance between points farthest from each other needs to be 2 mm or more. When a distance between the sample stage 105 and the charging control electrode 106 is set as L, an emission angle of low angle backscattered electrons, that is, an angle formed by the backscattered electrons and the surface of the sample is set as θ, and an outer diameter of the (entire) second opening is set as R, a relation of R>L×tan (90°−θ) needs to be satisfied in order to prevent the low angle backscattered electrons from being lost. In order to prevent the low angle backscattered electrons emitted at up to about θ=30° from being lost, the outer diameter R of the second opening needs to be 2 mm or more as shown in FIG. 6.

(C) Configuration Applicable to Both of First and Second Embodiments

Use of Semiconductor Detector

In the first and second embodiments, for example, an Everhart Thomley (ET) detector can be used as the backscattered electron detector 104 provided between the objective lens 103 and the sample stage 105, and a semiconductor detector 110 may be used as the backscattered electron detector 104. FIG. 9 shows a configuration example in which the semiconductor detector 110 is disposed between the objective lens 103 and the sample stage 105.

Since the semiconductor detector 110 includes, for example, a scintillator, a light guide, and a semiconductor element (pn-type, pnp-type, npn-type, SiPM, SDD, or the like), it is difficult to directly apply an electrostatic voltage. Therefore, a conductive material housing 108 and a scintillator surface conductive material coating 109 are added and an electrostatic focus correction is performed. Even in such a case, in the first and second embodiments, the charging control can be performed by using the semiconductor detector 110 as the backscattered electron detector 104, and replacing the electrostatic electrode with the conductive material housing 108 and the scintillator surface conductive material coating. Here, the backscattered electron detector 104 is replaced with the semiconductor detector 110, and the electrostatic electrode is replaced with the scintillator surface conductive material coating and the conductive material housing 108 accommodating the semiconductor detector 110. Therefore, when the semiconductor detector 110 is used in the first embodiment, if a voltage applied to the conductive material housing 108 and the scintillator surface conductive material coating is changed, a voltage applied to the sample stage 105 is also changed accordingly. When the semiconductor detector 110 is used in the second embodiment, if a voltage applied to the conductive material housing 108 and the scintillator surface conductive material coating is changed, a voltage applied to the charging control electrode 106 is also changed accordingly (as described above, an optimum applied voltage is obtained by curve fitting).

Case where Voltage is Applied to Backscattered Electron Detector 104

In the first and second embodiments and further an embodiment in which the semiconductor detector 110 is used as the backscattered electron detector 104, it is assumed that a voltage is applied to the electrostatic electrode (backscattered electron detector 104) or to the conductive material housing and the scintillator surface conductive material coating and the electrostatic focus correction is performed. Alternatively, however, a voltage may be applied to the backscattered electron detector 104. FIG. 10 shows a configuration example in which a reverse bias voltage is applied to the semiconductor detector 110 serving as the backscattered electron detector 104.

As shown in FIG. 10, when the semiconductor detector 110 (pn-type, SiPM, or the like) is used as the backscattered electron detector 104 to be provided between the objective lens 103 and the sample stage 105, a reverse bias voltage is generally applied to a PN junction for a purpose of responsiveness and S/N improvement. A magnitude of the reverse bias voltage is at most about 10 V to 100 V, but there is a case that a connection may be switched between a reverse bias potential and a GND. That is, when an inner diameter of an annular semiconductor element is not sufficiently large, since the reverse bias voltage influences energy, a trajectory (tilt), and an aberration of the primary electrons, the GND connection is established even at the cost of S/N. It is considered that this switching causes the electric field on the sample to fluctuate. Therefore, charging control of the sample can be performed by the operation of the first or second embodiment, and the fluctuation of the electric field on the sample can be corrected.

Configuration Example of GUI (i) Configuration Example of Voltage Value Setting GUI FIG. 11 shows a configuration example of a voltage value setting GUI applicable to the first and second embodiments.

When an ABCC (Auto Brightness Contrast Control) function is turned on at the time of measurement (when automatic image contrast adjustment 1101 and image brightness adjustment 1102 are selected), values of contrast 1103 and brightness 1104 are automatically adjusted and displayed, and these values are automatically adjusted. When the ABCC function is ON, even if the sample stage 105 and the charging control electrode 106 are changed, the brightness and the contrast are automatically adjusted to be easy for the user to see. Therefore, even if the sample is charged up, the change cannot be recognized on an image.

Then, the ABCC function is turned off (the automatic image contrast adjustment 1101 and the image brightness adjustment 1102 are unchecked), and a charging control function is turned on (electrostatic AF 1105 and charging control 1106 are checked). Thus, a sample stage (charging control electrode) voltage value adjustment display 1107 is activated. In the GUI (FIG. 11), 0 to 65535 represent 16-bit DACs, and a voltage value can be set with a 16-bit resolution. In the first embodiment, the voltage of the sample stage 105 becomes minimum when the value is 0, and the voltage of the sample stage 105 becomes maximum when the value is 65535. In the second embodiment, the voltage of the charging control electrode 106 becomes minimum when the value is 0, and the voltage of the charging control electrode 106 becomes maximum when the value is 65535. By introducing such a GUI, the user can set an appropriate voltage value while viewing the image in a state in which an image brightness/contrast automatic adjustment function is not activated. Specifically, when a set voltage value is adjusted in the sample stage (charging control electrode) voltage value adjustment display 1107, return of the secondary electrons is adjusted, and a charging amount of the sample stage 105 is controlled. By controlling the charging amount of the sample stage 105, brightness of the obtained image changes, and thus the user can select an image having a desired brightness.

(ii) Configuration Example of On-Sample Electric Field Value Setting GUI

FIG. 12 shows a configuration example of an on-sample electric field value setting GUI applicable to the first and second embodiments.

The ABCC function is turned off (the automatic image contrast adjustment 1101 and the image brightness adjustment 1102 are unchecked), and the charging control function is turned on (the electrostatic AF 1105 and the charging control 1106 are checked). Then, a display of automatic adjustment of values of the contrast 1103 and the brightness 1104 is switched to an on-sample electric field adjustment display 1201. In FIG. 12, 0 to 65535 represent 16-bit DACs, and an electric field value can be set with a 16-bit resolution. In the first and second embodiments, when the electric field value is set to 0, the electric field on the sample becomes minimum (zero). On the other hand, when the electric field value is set to 65535, the electric field on the sample becomes maximum. By configuring the GUI in this manner, the user can set an appropriate electric field on the sample while viewing the image in a state in which the image brightness/contrast automatic adjustment function is not activated.

Focus Correction Operation (i) Normal Focus Correction Operation (According to Related Art)

A typical procedure of focus correction using the objective lens 103 and the electrostatic electrode in combination in a normal case (without a charging control flow) will be described. First, the stage is used to move the field of view to a sample position to be observed. At this time, since an observation position changes, a height of the sample also changes greatly. Since a focus correction amount also increases, focus adjustment suitable for coarse adjustment is performed by the objective lens 103. After the coarse adjustment, the electrostatic focus correction is executed. This is because, once the coarse adjustment is completed, use of high-speed electrostatic focus correction for subsequent fine adjustment contributes to an improvement in throughput.

Even when acceleration voltage is switched or the field of view is moved by image shift, the focus does not greatly change. Therefore, in general, the electrostatic focus correction is performed in preference to the coarse adjustment. However, although it can be said that the focus does not greatly change, the applied voltage can be changed by about 100 V when converted into a voltage value of the electrostatic electrode. Accordingly, the electric field on the sample may vary by about 10 V/mm. The variation is sufficient to change image quality of an image that is likely to be influenced by charging, such as a secondary electron image. Therefore, it is difficult to obtain a good image only by executing the normal focus correction operation.

(ii) Focus Correction Operation According to Present Disclosure

In contrast, in a flow of a charging control method according to the present disclosure, when the coarse adjustment performed by the objective lens 103 and the fine adjustment according to the electrostatic focus correction are completed, the user sets an appropriate charging state parameter using the GUI (see FIG. 11 or FIG. 12) while viewing the image quality. In the case of FIG. 11, the charging state parameter is the voltage value. In the case of FIG. 12, the charging state parameter is the electric field on the sample. In either case, the control system (computer system) 220 stores the voltages of the sample stage 105 or the charging control electrode 106 and the electrostatic electrode (backscattered electron detector 104) in a memory (storage device) (not shown), calculates the electric field on the sample, and stores the calculated electric field on the sample in the memory. When the focus correction is performed by the electrostatic electrode accompanying the acceleration voltage switching or the movement of the field of view performed by the image shift, the control system 220 sets the potential of the sample stage 105 or the charging control electrode 106 such that the electric field on the sample coincides with a calculated value stored in the memory.

(D) Overview (i) In the present embodiment, the control system (computer system) constituting the charged particle beam system adjusts a value of the electric field on the sample in accordance with the change in the voltage applied to the backscattered electron detector that adjusts the focus of the charged particle beam irradiated to the sample (a change in the applied voltage at the time of the focus adjustment) in the charged particle beam device. Accordingly, since the value of the electric field on the sample is adjusted, the acquired image of the sample can be adjusted to have a desired brightness (improvement of the image quality). In the present embodiment, the method according to the first embodiment and the method according to the second embodiment are proposed as modes of adjusting the value of the electric field on the sample.

(ii) In the first embodiment, the control system adjusts the value of the electric field on the sample by controlling the voltage applied to the sample stage. More specifically, the backscattered electron detector is disposed at the position of the principal surface of the objective lens. At this time, the control system controls the voltage applied to the backscattered electron detector so as to adjust the focus to a desired focus state, and controls the voltage applied to the sample stage so as to adjust the electric field on the sample to a preset value. Accordingly, it is possible to improve the image quality and the throughput by a very simple method.

(iii) In the second embodiment, in the charged particle beam device, the charging control electrode is disposed between the backscattered electron detector and the sample stage. The control system adjusts the value of the electric field on the sample by controlling the voltage applied to the charging control electrode in accordance with the change in the voltage applied to the backscattered electron detector. More specifically, the backscattered electron detector is disposed at the position of the principal surface of the objective lens. At this time, the control system controls the voltage applied to the backscattered electron detector so as to adjust the focus to a desired focus state, and accordingly controls the voltage applied to the charging control electrode so as to adjust the electric field on the sample to a preset value. When a fixed voltage such as a retarding voltage is applied to the sample stage, the method according to the first embodiment cannot be adopted, but by providing the charging control electrode as in the second embodiment to adjust the value of the electric field on the sample, it is possible to improve the image quality without influencing the application of the retarding voltage.

(iv) As a configuration that can be commonly applied to the first and second embodiments, the backscattered electron detector can be a semiconductor-type detector having a structure to which a voltage for electrostatic focus correction can be applied. When the backscattered electron detector is of a semiconductor type, the control system may switch a reverse bias voltage applied to a detector element provided in the backscattered electron detector between a breakdown voltage and a GND, and when the reverse bias voltage is switched to the GND, the control system may control the voltage applied to the sample stage or the charging control electrode so as to adjust the electric field on the sample to a preset value.

In the first and second embodiments, the control system may output a GUI for setting a value of the voltage applied to the sample stage or the charging control electrode on a screen of a display (not shown), and adjust the electric field on the sample according to the value of the voltage (which can be designated by an operator) set on the GUI. As a modification, in the first and second embodiments, the control system may output a GUI for setting the value of the electric field on the sample on a screen of the display, and control the value of the voltage applied to the sample stage or the charging control electrode according to the value of the electric field (which can be designated by an operator) set on the GUI to adjust the electric field on the sample.

Further, in the first and second embodiments, the control system may hold information on the value of the electric field on the sample corresponding to the voltage applied to the backscattered electron detector (hold the information in a memory (not shown)), acquire the information on the value of the electric field on the sample corresponding to the applied voltage from the memory when the voltage applied to the backscattered electron detector changes, and set the voltage applied to the sample stage or the charging control electrode such that the electric field on the sample is at the acquired value of the electric field. Accordingly, parameter setting can be simply performed, and the image quality and the throughput can be easily improved.

In the second embodiment, the charging control electrode may have a thickness smaller than the distance between the backscattered electron detector and the sample stage, and may include the first opening and the second opening that has a mesh shape. When the distance between the sample stage and the charging control electrode is set as L, the angle formed by the backscattered electrons and the surface of the sample is set as θ, and the outer diameter of the second opening is set as R, the charging control electrode can be configured to satisfy the relation of R>L×tan (90°−θ).

(v) Functions according to the embodiments of the present disclosure can also be implemented by a program codes of software. In this case, a storage medium in which the program code is recorded is provided to the system or a device, and a computer (or a CPU or an MPU) of the system or the device reads the program codes stored in the storage medium. In this case, the program code itself read from the storage medium implements the functions according to the above-described embodiments, and the program code itself and the storage medium storing the program code constitute the present disclosure. Examples of the storage medium for supplying such a program code include a flexible disk, a CD-ROM, a DVD-ROM, a hard disk, an optical disk, a magneto-optical disk, a CD-R, a magnetic tape, a nonvolatile memory card, and a ROM.

Based on an instruction of the program code, an OS (operating system) or the like running on the computer system may perform a part or all of actual processing, and the functions according to the above-described embodiments may be implemented by the processing. Further, after the program code read from the storage medium is written in the memory on the computer system, the CPU or the like of the computer may perform a part or all of the actual processing based on the instruction of the program code, and the functions according to the above-described embodiments may be implemented by the processing.

Further, the program code of the software for implementing the functions according to the embodiments may be stored in a storage unit such as a hard disk or a memory of the system or the device or in a storage medium such as a CD-RW or a CD-R by distributing the program code via a network, and the computer (or the CPU or the MPU) of the system or the device may read and execute the program code stored in the storage unit or the storage medium at the time of use.

The processes and techniques described herein are not essentially associated with any particular device and can be implemented with any suitable combination of components. Further, various types of devices for general purposes may be used in accordance with teachings described herein. A specialized device for executing the functions described herein may be constructed. In addition, a plurality of constituent elements disclosed in the present embodiment may be appropriately combined. For example, some constituent elements may be deleted from all the constituent elements disclosed in the embodiments. Further, constituent elements in different embodiments may be appropriately combined. The present disclosure has been described with reference to specific examples, which are for illustrative purposes only and not for purposes of limitation. A person skilled in the art will recognize that there are numerous combinations of hardware, software, and firmware that are suitable for carrying out the present disclosure. For example, described software may be implemented in a wide range of programs or scripting languages such as an assembler, C/C++, perl, Shell, PHP, and Java (registered trademark).

Further, in the above embodiments, control lines and information lines show what considered to be necessary for description, and not all control lines and information lines are necessarily shown on a product. All of the configurations may be connected to each other.

In addition, to a person with ordinary skill in the art, other implementations of the present disclosure will be apparent from consideration of the specification and the embodiments of the present disclosure disclosed herein. The various aspects and/or components of the described embodiments can be used alone or in any combination. It is intended that the specification and the specific examples be considered as exemplary only, and the scope and the spirit of the present disclosure are set forth in the following claims.

DESCRIPTION OF REFERENCE NUMERALS 10 semiconductor measurement system (charged particle beam system)
100 charged particle beam device
101 chamber
102 booster
103 objective lens
104 backscattered electron detector
105 sample stage
106 charging control electrode
107 secondary electron detector
108 conductive material housing
109 scintillator surface conductive material coating
201 electron gun
202 first aligner
203 stigmator
204 first condenser lens
205 objective movable diaphragm
206 second aligner
207 second condenser lens
208 first scanning deflector (scanning deflection coil)
209 second scanning deflector (scanning deflection coil)
120 detector control unit
121 objective lens control unit
122 electrostatic electrode voltage control unit
123 sample stage voltage control unit
124 charging control electrode control unit
130 image processing unit
135 control unit
140 GUI
220 control system (computer system)
221 electron optical control unit
230 scanning control unit
231 deflection control unit
301 first opening
302 second opening

The invention claimed is:
1. A charged particle beam system, comprising:
a charged particle beam device; and
a computer system configured to control the charged particle beam device, wherein
the charged particle beam device includes an objective lens, a sample stage, and a backscattered electron detector that is disposed between the objective lens and the sample stage and that adjusts a focus of a charged particle beam with which a sample is irradiated, the backscattered electron detector is disposed at a position of a principal surface of the objective lens, the computer system adjusts a value of an electric field on the sample in accordance with a change in a voltage applied to the backscattered electron detector, the computer system adjusts the value of the electric field on the sample by controlling a voltage applied to the sample stage, and the computer system switches a reverse bias voltage applied to a detector element provided in the backscattered electron detector between a breakdown voltage and a GND, and sets or controls the voltage applied to the backscattered electron detector and the voltage applied to the sample stage so that the focus becomes a desired focus state and so that the electric field on the sample becomes a preset value.

2. The charged particle beam system according to claim 1, wherein
the desired focus state is a state where a focal position and a surface height of the sample coincide.

3. The charged particle beam system according to claim 2, wherein
the desired focus state is a state where a resolution becomes minimum.

4. The charged particle beam system according to claim 1, wherein
the charged particle beam device further includes a charging control electrode disposed between the backscattered electron detector and the sample stage, and
the computer system adjusts the value of the electric field on the sample by controlling a voltage applied to the charging control electrode in accordance with the change in the voltage applied to the backscattered electron detector.

5. The charged particle beam system according to claim 4, wherein
the computer system controls the voltage applied to the backscattered electron detector so as to adjust the focus to a desired focus state, and controls the voltage applied to the charging control electrode so as to adjust the electric field on the sample to a preset value.

6. The charged particle beam system according to claim 1, wherein
the backscattered electron detector is of a semiconductor type and has a structure that allows voltage application for electrostatic focus correction.

7. The charged particle beam system according to claim 2, wherein
the computer system outputs a GUI for setting a value of the voltage applied to the sample stage, and adjusts the electric field on the sample according to the value of the voltage set on the GUI.

8. The charged particle beam system according to claim 4, wherein
the computer system outputs a GUI for setting a value of the voltage applied to the charging control electrode, and adjusts the electric field on the sample according to the value of the voltage set on the GUI.

9. The charged particle beam system according to claim 2, wherein
the computer system outputs a GUI for setting the value of the electric field on the sample, controls a value of the voltage applied to the sample stage according to the value of the electric field set on the GUI and adjusts the electric field on the sample.

10. The charged particle beam system according to claim 4, wherein
the computer system outputs a GUI for setting the value of the electric field on the sample, controls an applied voltage of the charging control electrode according to the value of the electric field set on the GUI and adjusts the electric field on the sample.

11. A charged particle beam system comprising:
a charged particle beam device; and
a computer system configured to control the charged particle beam device, wherein
the charged particle beam device includes an objective lens, a sample stage, and a backscattered electron detector that is disposed between the objective lens and the sample stage and that adjusts a focus of a charged particle beam with which a sample is irradiated,
the computer system adjusts a value of an electric field on the sample in accordance with a change in a voltage applied to the backscattered electron detector,
the backscattered electron detector is of a semiconductor type, and
the computer system switches a reverse bias voltage applied to a detector element provided in the backscattered electron detector between a breakdown voltage and a GND, and controls a voltage applied to the sample stage so as to adjust the electric field on the sample to a preset value.

12. A charged particle beam system comprising:
a charged particle beam device; and
a computer system configured to control the charged particle beam device, wherein
the charged particle beam device includes an objective lens, a sample stage, and a backscattered electron detector that is disposed between the objective lens and the sample stage and that adjusts a focus of a charged particle beam with which a sample is irradiated,
the computer system adjusts a value of an electric field on the sample in accordance with a change in a voltage applied to the backscattered electron detector,
the charged particle beam device further includes a charging control electrode disposed between the backscattered electron detector and the sample stage, and
the computer system adjusts the value of the electric field on the sample by controlling a voltage applied to the charging control electrode in accordance with the change in the voltage applied to the backscattered electron detector,
the backscattered electron detector is of a semiconductor type, and
the computer system switches a reverse bias voltage applied to the backscattered electron detector between a breakdown voltage and a GND, and controls, in conjunction, the voltage applied to the charging control electrode so as to adjust the electric field on the sample to a preset value.

13. A charged particle beam system comprising:
a charged particle beam device; and
a computer system configured to control the charged particle beam device, wherein
the charged particle beam device includes an objective lens, a sample stage, and a backscattered electron detector that is disposed between the objective lens and the sample stage and that adjusts a focus of a charged particle beam with which a sample is irradiated,
the computer system adjusts a value of an electric field on the sample in accordance with a change in a voltage applied to the backscattered electron detector, the computer system adjusts the value of the electric field on the sample by controlling a voltage applied to the sample stage, and the computer system holds information on the value of the electric field on the sample corresponding to an applied voltage of the backscattered electron detector, acquires the information on the value of the electric field on the sample corresponding to the applied voltage when the applied voltage of the backscattered electron detector changes, and sets the voltage applied to the sample stage such that the electric field on the sample is at the acquired value of the electric field.

14. A charged particle beam system comprising:
a charged particle beam device; and
a computer system configured to control the charged particle beam device, wherein
the charged particle beam device includes an objective lens, a sample stage, and a backscattered electron detector that is disposed between the objective lens and the sample stage and that adjusts a focus of a charged particle beam with which a sample is irradiated, the computer system adjusts a value of an electric field on the sample in accordance with a change in a voltage applied to the backscattered electron detector, the charged particle beam device further includes a charging control electrode disposed between the backscattered electron detector and the sample stage, and the computer system adjusts the value of the electric field on the sample by controlling a voltage applied to the charging control electrode in accordance with the change in the voltage applied to the backscattered electron detector, the computer system holds information on the value of the electric field on the sample corresponding to an applied voltage of the backscattered electron detector, acquires the information on the value of the electric field on the sample corresponding to the applied voltage when the applied voltage of the backscattered electron detector changes, and sets the voltage applied to the charging control electrode such that the electric field on the sample is at the acquired value of the electric field.

15. A charged particle beam system comprising:
a charged particle beam device; and
a computer system configured to control the charged particle beam device, wherein
the charged particle beam device includes an objective lens, a sample stage, and a backscattered electron detector that is disposed between the objective lens and the sample stage and that adjusts a focus of a charged particle beam with which a sample is irradiated, the computer system adjusts a value of an electric field on the sample in accordance with a change in a voltage applied to the backscattered electron detector, the charged particle beam device further includes a charging control electrode disposed between the backscattered electron detector and the sample stage, and the computer system adjusts the value of the electric field on the sample by controlling a voltage applied to the charging control electrode in accordance with the change in the voltage applied to the backscattered electron detector, the charging control electrode has a thickness smaller than a distance between the backscattered electron detector and the sample stage, and includes a mesh including a first opening and a second opening, and when a distance between the sample stage and the charging control electrode is set as L, an angle formed by a backscattered electron and a surface of the sample is set as $\theta$, and an outer diameter of an entire opening portion of the charging control electrode is set as R, a relation of $R > L \times \tan(90° - \theta)$ is satisfied.

16. A charged particle beam system comprising:
a charged particle beam device; and
a computer system configured to control the charged particle beam device, wherein
the charged particle beam device includes an objective lens, a sample stage, and a backscattered electron detector that is disposed between the objective lens and the sample stage and that adjusts a focus of a charged particle beam with which a sample is irradiated, the computer system adjusts a value of an electric field on the sample in accordance with a change in a voltage applied to the backscattered electron detector, the charged particle beam device further includes a charging control electrode disposed between the backscattered electron detector and the sample stage, and the computer system adjusts the value of the electric field on the sample by controlling a voltage applied to the charging control electrode in accordance with the change in the voltage applied to the backscattered electron detector, the charging control electrode includes an opening through which a primary electron beam and a secondary electron from the sample pass, and when a thickness of the charging control electrode is set as t and an inner diameter of the opening is set as r, the thickness t and the inner diameter r satisfy a relation of $0.01 \leq t/r \leq 1$.

* * * * *